(12) United States Patent
Moberg et al.

(10) Patent No.: US 10,601,385 B2
(45) Date of Patent: Mar. 24, 2020

(54) RECORDING LEVEL ADJUSTMENT USING A DISTANCE TO A SOUND SOURCE

(71) Applicant: Nokia Technologies Oy, Espoo (FI)

(72) Inventors: Marko S. Moberg, Kangasala (FI); Koray Ozcan, Farnborough (GB)

(73) Assignee: Nokia Technologies Oy, Espoo (FI)

( * ) Notice: Subject to any disclaimer, the term of this patent is extended or adjusted under 35 U.S.C. 154(b) by 515 days.

(21) Appl. No.: 15/291,466

(22) Filed: Oct. 12, 2016

(65) Prior Publication Data

US 2017/0033752 A1 Feb. 2, 2017

Related U.S. Application Data

(63) Continuation of application No. 12/925,515, filed on Oct. 21, 2010, now Pat. No. 9,496,841.

(51) Int. Cl.
*G06F 3/0482* (2013.01)
*G06F 3/0488* (2013.01)
(Continued)

(52) U.S. Cl.
CPC ......... *H03G 3/3005* (2013.01); *G06F 3/0482* (2013.01); *G06F 3/0488* (2013.01); *G06F 3/04817* (2013.01); *G06F 3/165* (2013.01); *G11B 20/10527* (2013.01); *H03G 3/3089* (2013.01); *G11B 2020/10574* (2013.01)

(58) Field of Classification Search
CPC .......... H03G 3/3005; H03G 3/3089; G06F 3/04817; G06F 3/0482; G06F 3/0488; G11B 20/10527
See application file for complete search history.

(56) References Cited

U.S. PATENT DOCUMENTS

| 4,509,189 A | 4/1985 | Simpson | 381/56 |
| 5,335,011 A | 8/1994 | Addeo et al. | 348/15 |

(Continued)

FOREIGN PATENT DOCUMENTS

| JP | 2006-222618 | 8/2006 |
| WO | WO-2010/014074 A1 | 2/2010 |

OTHER PUBLICATIONS

R.L. Hsu, et al., "Face Detection in Color Images", IEEE Transactions on Pattern Analysis and Machine Intelligence, 24:696-706, 2002.

(Continued)

*Primary Examiner* — Thai Q Tran
*Assistant Examiner* — Jose M Mesa
(74) *Attorney, Agent, or Firm* — Harrington & Smith

(57) ABSTRACT

An apparatus including a recording system including at least one microphone; a controller including a processor and a non-transitory memory, where the controller is configured to automatically adjust at least one recording parameter for a sound signal from the at least one microphone based, at least partially, upon a distance between the apparatus and a sound source; and a distance determinator configured to determine the distance between the apparatus and the sound source and provide the determined distance to the controller so as to adjust the at least one recording parameter, where the distance determinator includes at least one sensor and does not include the at least one microphone, where the apparatus is a portable electronic device.

20 Claims, 7 Drawing Sheets

(51) Int. Cl.
*H03G 3/30* (2006.01)
*G06F 3/0481* (2013.01)
*G06F 3/16* (2006.01)
*G11B 20/10* (2006.01)

(56) References Cited

U.S. PATENT DOCUMENTS

| | | | | |
|---|---|---|---|---|
| 5,459,786 | A | 10/1995 | Tomiyori et al. | 379/390.01 |
| 5,490,118 | A | 2/1996 | Nishioka et al. | 348/14 |
| 6,005,610 | A | 12/1999 | Pingali | 348/169 |
| 6,593,956 | B1 | 7/2003 | Potts et al. | 348/14.09 |
| 6,826,284 | B1 | 11/2004 | Benesty et al. | 381/92 |
| 6,956,955 | B1 | 10/2005 | Brungart | 381/310 |
| 7,440,755 | B2 | 10/2008 | Balachandran et al. | 455/435.2 |
| 7,489,788 | B2 | 2/2009 | Leung et al. | 381/92 |
| 8,094,834 | B1* | 1/2012 | Brungart | H04S 7/304 381/1 |
| 2002/0167862 | A1* | 11/2002 | Tomasi | G01S 5/18 367/118 |
| 2004/0051029 | A1* | 3/2004 | Hirai | G02B 7/34 250/201.2 |
| 2005/0113135 | A1* | 5/2005 | Goebel | H04M 1/0208 455/556.1 |
| 2005/0204037 | A1 | 9/2005 | Watanabe et al. | 382/104 |
| 2005/0246167 | A1* | 11/2005 | Nakajima | G01S 3/8083 704/213 |
| 2006/0198531 | A1* | 9/2006 | Berson | G11B 20/10527 381/61 |
| 2008/0039964 | A1* | 2/2008 | Charoenruengkit | G11B 27/036 700/94 |
| 2008/0100719 | A1 | 5/2008 | Huang | 348/211.99 |
| 2008/0266542 | A1 | 10/2008 | Yang et al. | 356/4.01 |
| 2009/0066798 | A1* | 3/2009 | Oku | G03B 31/00 348/207.99 |
| 2009/0240695 | A1* | 9/2009 | Angell | G06F 17/30781 |
| 2009/0322695 | A1* | 12/2009 | Cho | G06F 3/0416 345/173 |
| 2010/0026780 | A1 | 2/2010 | Tico et al. | 348/14.02 |
| 2010/0166198 | A1 | 7/2010 | Perman | 381/60 |
| 2011/0039598 | A1 | 2/2011 | Tang et al. | 455/556.1 |
| 2011/0102464 | A1 | 5/2011 | Godavari | 345/650 |

OTHER PUBLICATIONS

M.H. Yang et al., "Detecting Faces in Images: A Survey", IEEE Transactions on Pattern Analysis and Machine Intelligence, 24:34-58; 2002.
A. Hadid et al., "A Hybrid Approach to Face Detection Under Unconstrained Environments", International Conference of Pattern Recognition, (ICPR 2006).
U. Bub et al., "Knowing Who to Listen to in Speech Recognition: Visually Guided Beamforming", Interactive System Laboratories.
M. Collobert et al., "Listen: A System for Locating and Tracking Individual Speakers", France Telecom, IEEE Transaction (1999).
N. Strobel et al., "Joint Audio-Video Object Localization and Tracking" IEEE Signal Processing Magazine (2001).

* cited by examiner

RECORDING LEVEL ADJUSTMENT USING A DISTANCE TO A SOUND SOURCE

CROSS REFERENCE TO RELATED APPLICATION

This application is a continuation of copending application Ser. No. 12/925,515 filed Oct. 21, 2010 which is hereby incorporated by reference in its entirety.

BACKGROUND OF THE INVENTION

Field of the Invention

The invention relates to adjusting a sound level during recording and, more particularly, to adjusting the sound level or making a suggestion based upon an external parameter input.

Brief Description of Prior Developments

Recording microphones have certain characteristics including dynamic range. Some microphones are capable of recording a range of sound levels from very quiet to very loud. Sounds which are too soft for a particular microphone are not recorded properly, and sounds which are too loud for a particular microphone get distorted because the microphone cannot handle such sound pressures. Recording devices may process the recorded sounds and compensate the recording level within a certain range (automatic gain control, AGC), but if the sound level is too soft or too loud already when it enters the microphone there is nothing that can be done by the additional processing. The microphone capsules used in mobile devices usually do not tolerate high sound pressures but instead destroy the recorded signal completely if it is too loud.

SUMMARY

The following summary is merely intended to be exemplary. The summary is not intended to limit the scope of the claimed invention.

In accordance with one aspect of the invention, an apparatus is provided including a recording system for recording at least sound, the recording system including a microphone; a distance input adapted to have an initial distance between a source of the sound and the apparatus entered into the apparatus; and a controller connected to the microphone. The controller is configured to determine a change for a better sound recording by the recording system based, at least partially, on the initial distance input into the distance input.

In accordance with another aspect of the invention, a method is provided comprising receiving by an apparatus a first sound from a source of sound; and determining by the apparatus a suggestion to be provided to a user of the apparatus for better sound recording of sound from the source of sound by a microphone of the apparatus.

In accordance with another aspect of the invention, a method is provided comprising receiving by an apparatus first distance information regarding a distance between the apparatus and a source of sound; determining by the apparatus a second distance which the apparatus should be moved relative to the source of sound for better sound recording by a microphone of the apparatus; and based upon the determined second distance, suggesting by the apparatus to the user a change in distance between the apparatus and the source of sound.

In accordance with another aspect of the invention, a program storage device is provided which is readable by a machine, tangibly embodying a program of instructions executable by the machine for performing operations, the operations comprising, upon receiving by an apparatus input comprising a first sound from a sound source, determining by the apparatus a suggestion for the user for a better sound recording by a microphone of the apparatus; and if the apparatus determines that the apparatus should be moved relative to the sound source for the better sound recording by the microphone of the apparatus, then providing the user the suggestion by the apparatus.

In accordance with another aspect of the invention, a program storage device readable by a machine is provided, tangibly embodying a program of instructions executable by the machine for performing operations, the operations comprising: upon receiving by an apparatus input comprising first distance information regarding a distance between the apparatus and a source of sound, determining by the apparatus whether the apparatus should be moved relative to the source of sound for a better sound recording by a microphone of the apparatus; and if the apparatus determines that the apparatus should be moved relative to the source of sound for the better sound recording by the microphone of the apparatus, then suggesting by the apparatus to the user a change in distance between the apparatus and the source of sound.

In accordance with another aspect of the invention, an apparatus is provided comprising a recording system for recording at least sound, the recording system comprising a microphone; and a controller connected to the microphone, the controller being configured to determine a suggestion for the user, for subsequent recording of a second sound from a sound source, based upon characteristics of the microphone and a sound level of a first sound from the sound source received by the microphone.

BRIEF DESCRIPTION OF THE DRAWINGS

The foregoing aspects and other features of the invention are explained in the following description, taken in connection with the accompanying drawings, wherein.

DETAILED DESCRIPTION OF EMBODIMENTS

Figure 1:
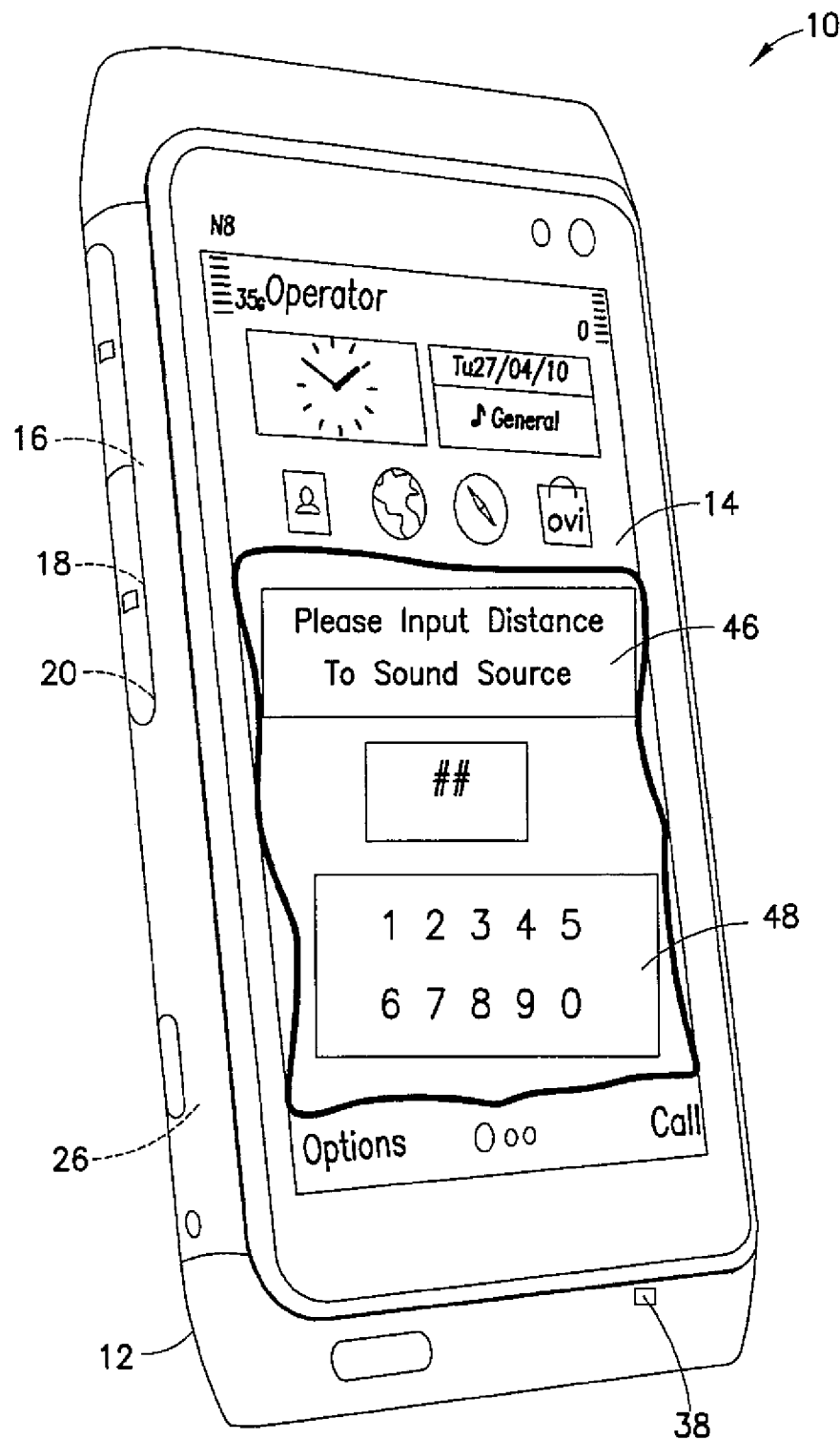
FIG. 1 is a perspective view of an apparatus comprising features of the invention.

Referring to FIG. 1, there is shown a perspective view of an apparatus 10 incorporating features of the invention. Although the invention will be described with reference to the example embodiments shown in the drawings, it should be understood that the invention can be embodied in many alternate forms of embodiments. In addition, any suitable size, shape or type of elements or materials could be used.

The apparatus 10 shown in FIG. 1 is a hand-held portable electronic device comprising a telephone application, Internet browser application, camera application, video recorder application, music player and recorder application, email application, navigation application, gaming application, and/or any other suitable electronic device application. The apparatus 10, in this example embodiment, comprises a housing 12, a touch screen 14 which functions as both a display and a user input, a receiver 16, a transmitter 18, a controller 20 which can include (referring also to FIG. 2) at least one processor 22, at least one memory 24, and software, and a rechargeable battery 26.

Figure 2:
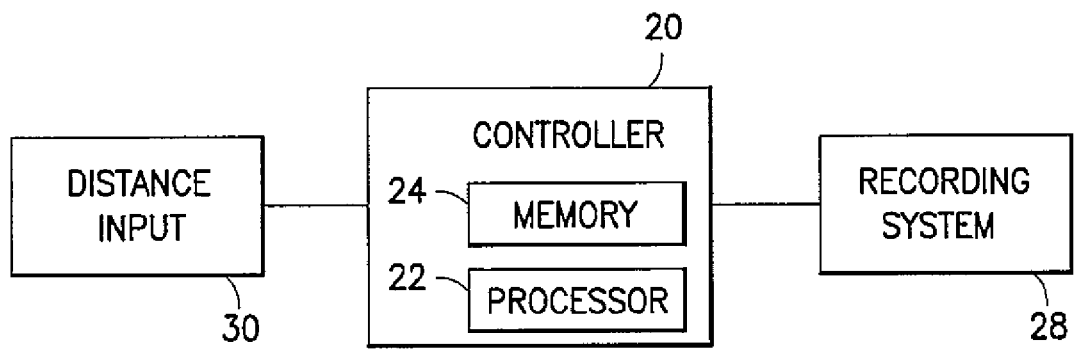
FIG. 2 is a diagram illustrating components of the apparatus shown in FIG. 1.
Figure 3:
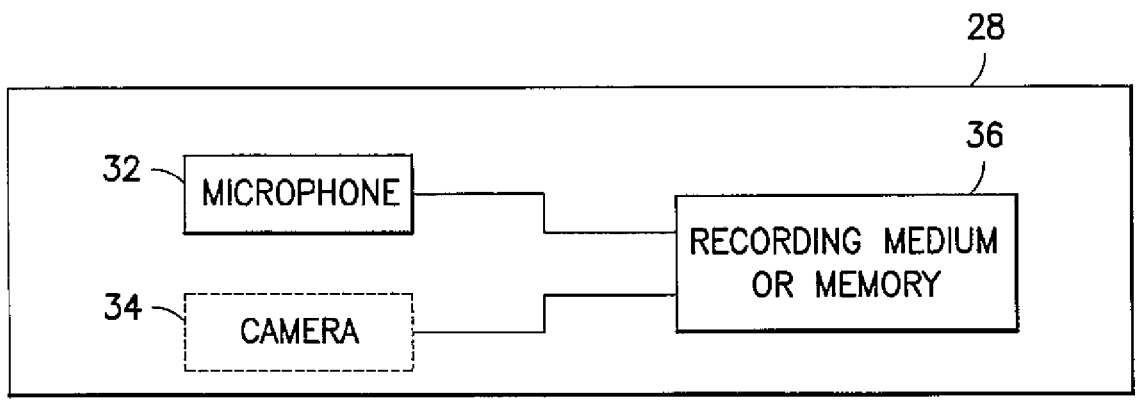
FIG. 3 is a diagram illustrating components of the recording system shown in FIG. 2.
Figure 4:
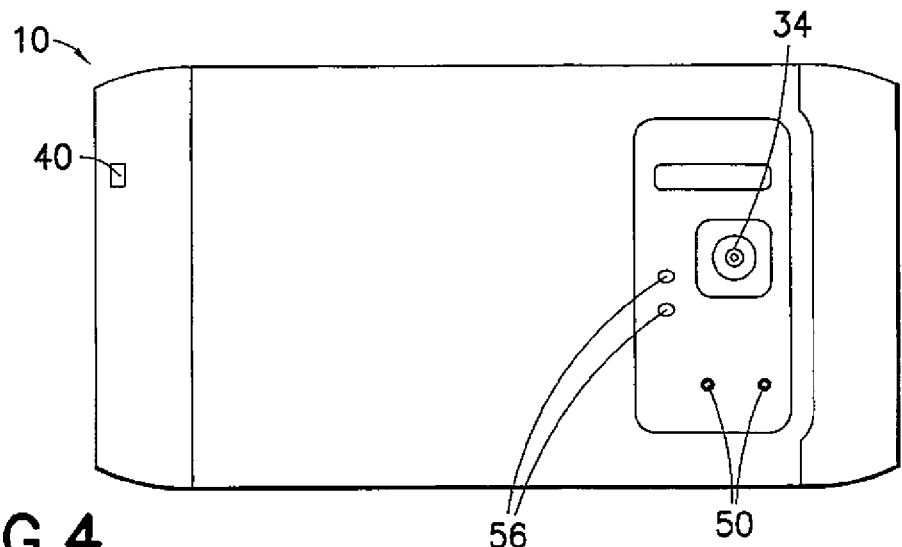
FIG. 4 is a plan view of a rear side of the apparatus shown in FIG. 1.

Referring also to FIG. 2, the apparatus 10 includes a recording system 28 and a distance input 30 connected to the controller 20. Referring also to FIG. 3, the recording system 28 in this example embodiment includes a microphone 32, a camera 34 and a recording medium 36 for recording sound and/or video or pictures. In this example embodiment the recording medium 36 is a solid state memory. However, any suitable recording medium could be used. In an alternate embodiment the camera 34 might not be provided. In a preferred embodiment the microphone 32 is a single microphone for the apparatus 10, and the housing 10 has multiple sound channels 38, 40 (see FIGS. 1 and 4) at the microphone 32 on different sides of the housing 12. The first sound channel 38 could be used for the telephone application; for the user to talk into during a telephone call. The second sound channel 40 could be used for sound recording or video recording.

The maximum sound pressure level (SPL) a microphone can accept is measured for particular values of total harmonic distortion (THD). This amount of distortion is generally inaudible, so one can safely use the microphone at this SPL without harming the recording. The higher the value, the better, although microphones with a very high maximum SPL also have a higher self-noise. A clipping level is perhaps a better indicator of maximum usable level. Harmonic distortion from microphones is usually of low-order (mostly third harmonic) type, and hence not very audible even at 3-5%. Clipping, on the other hand, usually caused by the diaphragm reaching its absolute displacement limit (or by a preamplifier), produces a harsh sound on peaks, and should be avoided if at all possible. For some microphones the clipping level may be much higher than the max SPL.

Figure 7:
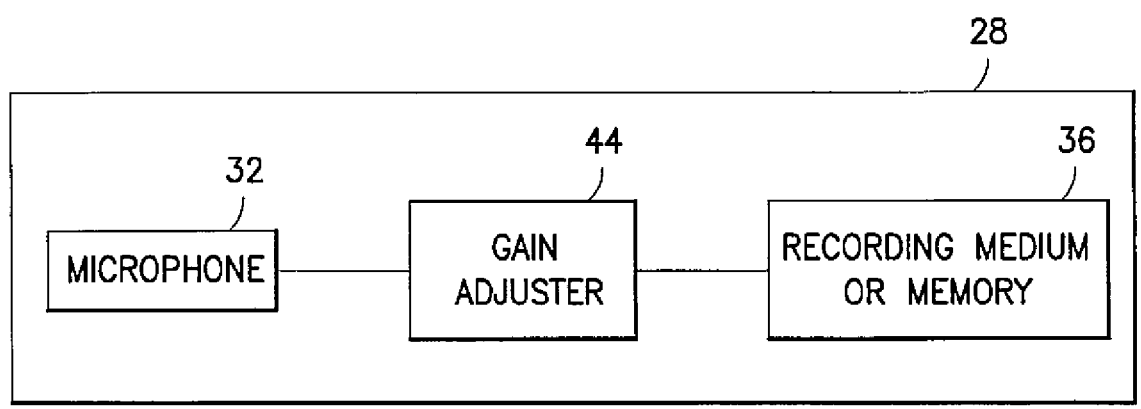
FIG. 7 is a diagram illustrating components of the recording system shown in FIGS. 2 and 3.
Figure 5:
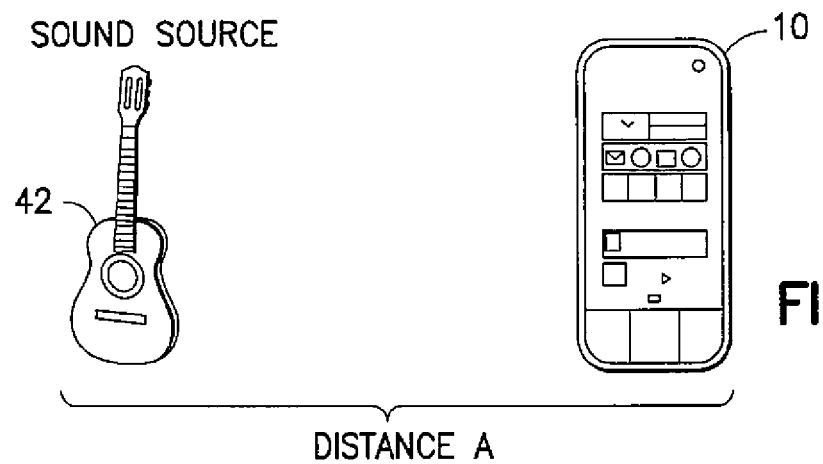
FIG. 5 is a diagram illustrating an initial distance between the apparatus and a source of sound.

Referring also to FIG. 5, when using the apparatus 10 for sound recording or video recording (where the video includes sound), the volume of the sound emanating from the sound source 42 and the Distance A between the apparatus 10 and the source 42 of the sound can be different on different occasions or at different events. Recording devices may process the recorded sounds and compensate the recording level within a certain range (automatic gain control, AGC). Automatic gain control (AGC) can be used to adjust the gain automatically within a certain range. As seen in FIG. 7, the apparatus 10 can comprise a gain adjuster 44, such as a variable gain amplifier or voltage controlled amplifier (VCA) for example, between the microphone 32 and the recording medium 36. However, if the sound level is already too soft or too loud when it enters the microphone 32, there is nothing that can be done by the additional gain processing. If the sound pressure from the loud sound is too high for the structure of the microphone 32, clipping would occur regardless of gain processing.

Although a fixed gain output microphone and a variable gain amplifier can be used in one example embodiment, that gains can be changed digitally or in analogue domain or both. To explain other possibilities, digital signal processing (DSP) can provide other adjustments such as EQs, specially designed filters i.e. wind noise, handling, etc. These features could be adaptive or depending on the recording conditions. Alternatively or additionally, the user can enter what kind of recording it may be as an input (i.e. concert, speech, environment, etc.) wherein further adjustments could be provided based on the selection. The microphone could be any microphone or any other suitable means or microphone components for capturing the sound (i.e. an electret condenser microphone, a digital microphone, a MEMS microphone, a directional microphone, etc.) and the system may comprise a microphone array with or without beamformer applications to arrange directionality.

Figure 6:
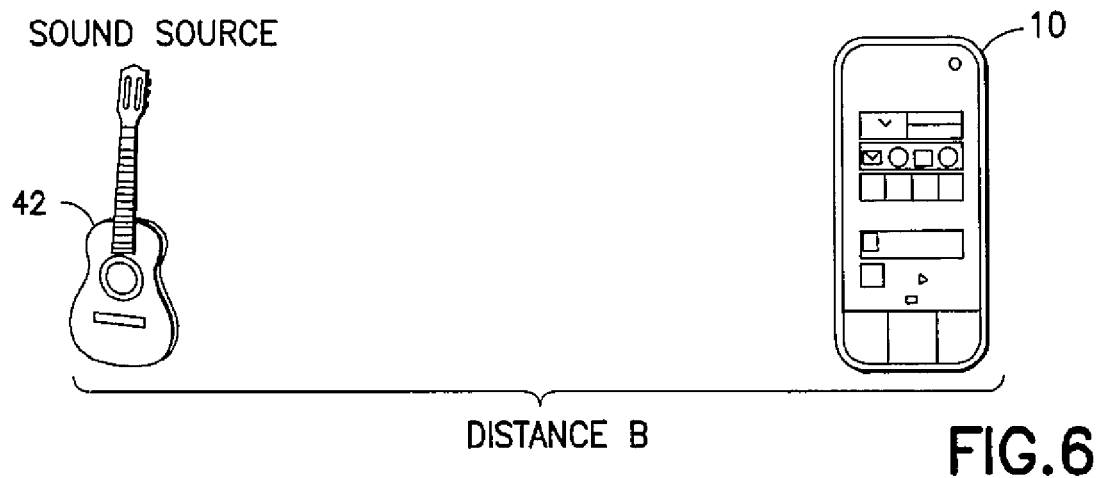
FIG. 6 is a diagram illustrating a modified distance between the apparatus and the source of sound for a better sound recording by the microphone.

A way to adjust the sound pressure which enters the microphone 32 to prevent clipping is to alter the distance between the sound source 42 and the microphone 32. In other words, to compensate for sound which is too loud (which would end up being clipped or distorted even with automatic gain control) the user can move the apparatus 10 away from the sound source 42, such as from the Distance A shown in FIG. 5 to a larger Distance B shown in FIG. 6. To compensate for sound which is too soft for the range of the microphone, the user can move the apparatus 10 closer to the source 42 of the sound.

One feature of the example apparatus 10 is the ability to suggest to the user an improved or even optimal recording distance between the apparatus 10 and the sound source 42 based on the sounds being created from a known distance. There is no need for complicated gain adjustment by the user. Instead, the apparatus can propose to the user a recording distance to make a better, and perhaps the best, quality recording. However, it should be noted that gain adjustment could be used in combination with features of the invention.

Figure 8:
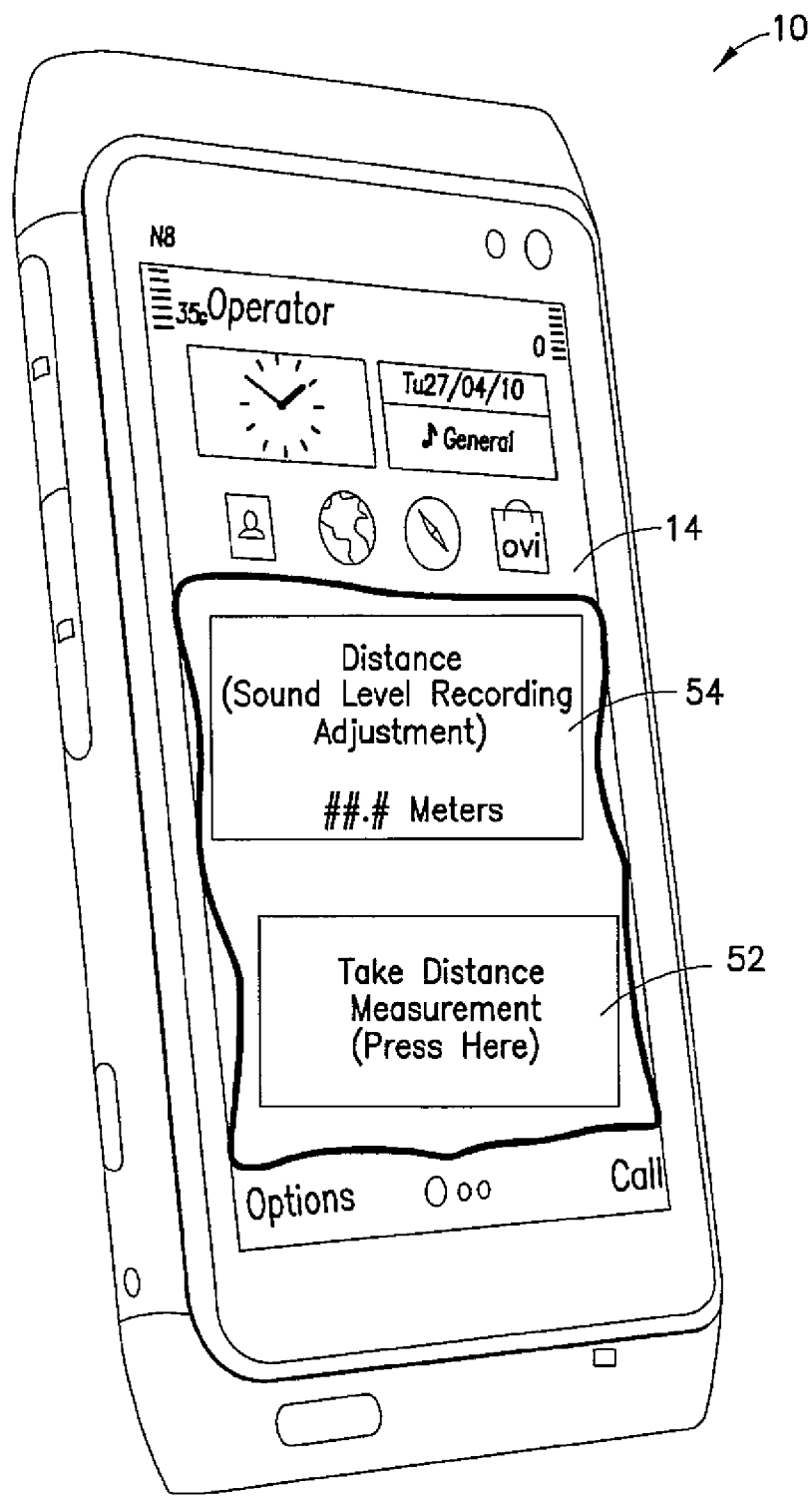
FIG. 8 is a perspective view of the apparatus shown in FIG. 1 with an example of a user interface for an automated distance measurement.

In the example embodiment the apparatus 10 is adapted to have the initial distance A (between the sound source 42 and the apparatus 10) input into the apparatus 10 in two possible ways. First, the user could manually input the initial distance A. For example, as seen in FIG. 1, the software could be configured to display on the touch screen 14 a prompt 46 and keypad 48 for the user to input the amount of the Distance A. The user can estimate this distance. Thus, the touch screen 14 could function as the distance input 30 shown in FIG. 2. Additionally, or alternatively, the initial distance A could be determined by the sensors 50 (see FIG. 4) used for the autofocus feature of the camera. Referring also to FIG. 8, the software could be configured to generate a prompt or icon 52 on the touch screen 14 for the user to use the sensors 50 to determine the initial distance A. Thus, the sensors 50 can form part of the distance input 30. The distance could be shown at area 54 for the user's information and confirmation that the distance has been determined and entered for the software to determine the best distance for sound recording.

Alternatively, or additionally, a different distance measuring device 56 could be used, such as with use of a laser light for example.

Figure 9:
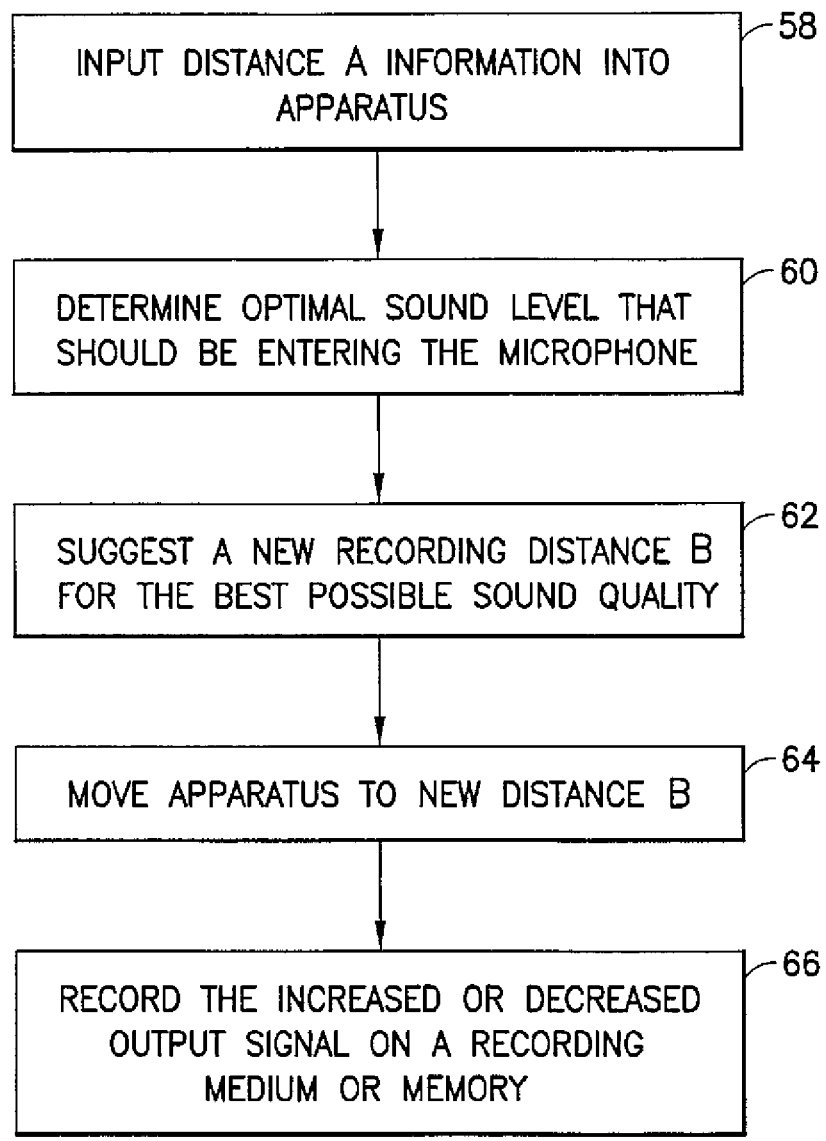
FIG. 9 is a block diagram illustrating some steps of a method of the invention.

Referring also to FIG. 9, with the known distance A between the sound source 42 and the microphone 32 of the apparatus 10 input into the apparatus as indicated by block 58, and the known loudest sound from the sound source 42, the apparatus 10 is configured to calculate the optimal sound level that should be entering the microphone (based upon the known microphone properties) as indicated by block 60. In one type of alternate embodiment, rather than the user entering the initial distance, the apparatus 10 can be configured to prompt the user to play/sing something from the distance A from the apparatus 10.

Figure 10:
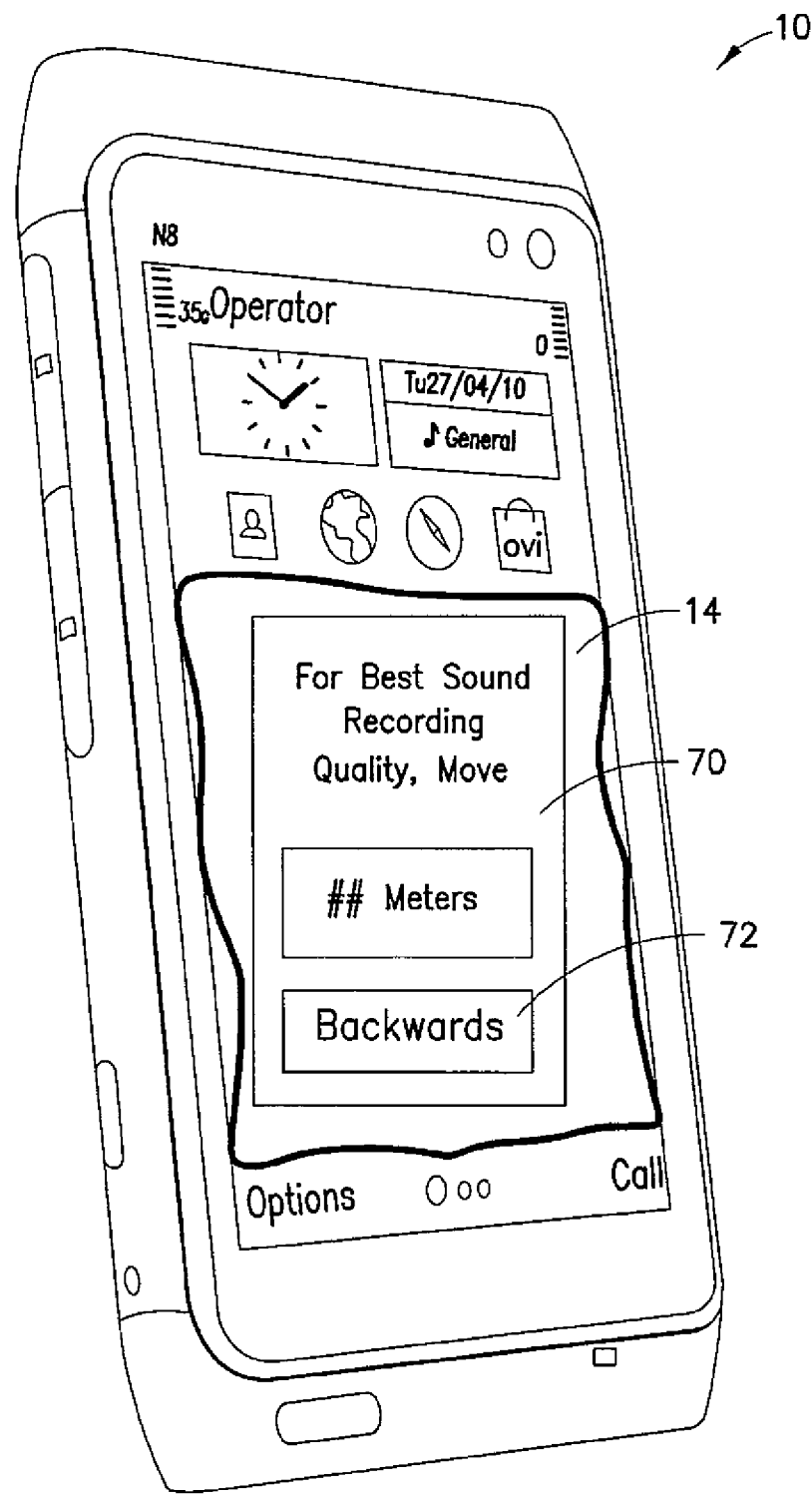
FIG. 10 is a perspective view of the apparatus shown in FIG. 1 with an example of a user interface suggesting a change in distance of the apparatus relative to the source of the sound.

As indicated by block 62, based on the sound information received by the microphone, the apparatus 10 can suggest the new recording distance B for the best possible sound quality (or at least for a better sound quality compared to recording at the distance A). FIG. 10 shows an example where the touch screen 14 displays the message 70 to the user to increase the distance between the sound source 42 and the apparatus by #.# meters. The message could alternatively indicate to the user to decrease the distance, or that the distance is correct for the best quality sound recording. For example, area 72 indicates to move the apparatus away from the sound source 42 by indicating "Backwards", but could indicate to move the apparatus towards the sound source 42, such as indicating "closer" or "forwards". These are only examples of nomenclature or wording which could be used and should not be considered as limiting the invention. For example, rather than words, a pictorial or graphical equivalent symbol(s) could be used. In another alternate embodiment, the apparatus might only be configured to signal the user to increase the distance; not decreasing the distance.

The message 70 could indicate the exact Distance B rather than (or in addition to) indicating the amount of distance to be moved (B-A or A-B). The user can then move the apparatus 10 and/or the sound source 42 to obtain the distance B as indicated by block 64. During the subsequent sound recording at Distance B, the apparatus 10 can adjust the internal gain accordingly to obtain the best possible dynamic range without clipping the loudest sounds as indicated by block 66.

In one type of embodiment, the display 14 and software could continuously make suggestions to the user regarding the distance. For example, during the middle of a song by the sound source 42, the apparatus 10 might suggest moving the apparatus 10 closer to the sound source 42, but suggest moving the apparatus further away from the sound source during the beginning and/or ending of the song.

In one type of use of the invention, a user could use the apparatus 10 to record a pre-recorded song, such as playing on the user's home audio equipment. For example, the user might have the song on an old phonograph album, and want to have the song on the apparatus so it can now be listened to away from home. The apparatus 10 could be programmed to measure the microphone's sound quality over a period of time (such as by being turned ON and OFF by the user for example). An example of the period of time could be playing the song for its entire song length. The apparatus could then suggest to the user to move the apparatus 10 closer to or further away from the speakers of the home audio equipment to copy the song at a better or best quality when the song is played for a second time.

In another type of use of the invention, the user could use the apparatus to record personal live performances, such as to be uploaded onto an Internet site such as YOUTUBE for example. The user could position the apparatus 10 at a certain initial distance from where the user is performing his or her musical performance, turn the apparatus ON to measure the microphone's sound quality over a period of time, read the distance suggestion by the apparatus 10, relocated the apparatus 10 relative to the user based upon the suggestion, and then record the performance by the user at the modified distance.

Although the examples above have been described with use of a touch screen, a touch screen is not required. Features of the invention could be used in an apparatus which did not have a touch screen. Although the examples above have been described in regard to a distance parameter, features of the invention could be used with an additional or alternative parameter. For example, a noise canceller feature could be provided in the apparatus by use of a microphone directionality function. In this example, the microphone might comprise a microphone array which can provide a directional microphone feature. Thus, the apparatus can use the directional microphone feature to limit sound from one or more limited directions. If the recording environment is noisy, such as in a nightclub for example, a user could use the noise canceller/directionality feature to obtain a better sound recording of the sound source (such as a band on stage). The apparatus could be configured to have the user manually active the noise canceller/directionality feature. The user could then point the microphone in a certain direction or change an angle of the apparatus a certain amount (as suggested by the apparatus) for better or more optimum sound recording. The apparatus could be configured to suggest to the user to activate the noise canceller/directionality feature. This suggestion could be in the form of a question. For example, the apparatus could provide the suggestion/question "Do you want to activate the "noise canceller/directionality feature for better sound recording?"". Other recording sound environments could be analyzed and additional or alternative parameters could be programmed into the software to be used for better sound recording by suggesting to the user a change in the apparatus location, or position, or orientation relative to the sound source, or configuration/reconfiguration of the apparatus itself. An example of a suggestion relating to configuration/reconfiguration of the apparatus could be suggesting to the user to open a cover of a flip phone or slide open or close a cover in a slide phone.

The known distance (initial distance) between the sound source and the recording apparatus is not a necessity to practice features of the invention. The known distance allows the apparatus to tell the suggested distance in terms of an exact unit (e.g. in meters). Features of the invention can be used merely with a sound level as a input parameter for subsequently suggesting a change in the apparatus location, or position, or orientation relative to the sound source, or configuration/reconfiguration of the apparatus itself. If the distance is not known, and only the sound is detected and analyzed, in one example embodiment the apparatus can still suggest whether the distance to the sound source should be increased or decreased (but in cannot give any exact measures).

In the preferred example embodiment described above, both the sound level and the input distance information itself is used by the apparatus 10 to give the user a suggestion. The system may comprise a library or a lookup table wherein predetermined values could be provided like a threshold table. The system would know the operation range of the microphone and its sensitivity as a function of the source distance. Such determination could be based on the lookup table which may comprise the frequency so that it could be known that a particular frequency at a specific source distance could provide an approximate sensitivity. Accordingly, it could be possible to provide a gain adjustment based on the given distance within the safety limits without damaging or saturating the microphone; to prevent distortion or clipping. The system may have a radar or other means of distance measurement; i.e. by using an ultrasonic range of frequencies also meaning that the system may comprise suitable transducers to transmit and capture ultrasonic range of frequencies (within the audio band, there are still certain frequency components that could be for calculation of the distance measurement) wherein such distance measurement could be measured and accordingly gains can be adjusted for the recording gain level.

An apparatus comprising features of the invention can provide the initial distance for recording. Based on the sounds generated at that distance, the apparatus could then propose the second, more optimal distance. For example, the device could prompts the user with the message "sing 1 meter away from the microphone". After analyzing the sound, the apparatus could propose a new distance with the prompt "move closer than 0.5 meter from the microphone".

Telecommunication devices such as mobile or cellular handsets provide speech call functionality, but also entertainment audio functionality such as audio/visual recording. It is understood that these example use cases comprise a processing for uplink audio wherein a microphone output is suitably configured. The recorded signal quality may depend on various factors such as source signals, electronic components such as a microphone component itself, electronic circuitry, baseband, signal processing, environmental noise, etc. It is furthermore known that the distance between the microphone and source signal is an important contributor for the final quality because such signal level varies with the distance. It may, therefore, be important to adjust microphone sound level as a function of a recording distance or other external or environmental parameters. To overcome these known problems, the present invention can provide a system wherein a suitably configured user interface (UI) allows the user to enter a value representing a recording distance between the source signal and the microphone, or suggests a change relating to an external or environmental parameter. The reception of sound at the microphone, and/or processing of the received sound, can be relatively adjusted based upon how the user interacts with the user interface. Suitably configured user interface and software support can be provided that possibly modifies gain levels, which may be variable and/or fixed gain levels, in analogue domain and/or possibly in digital domain such as the level of digital EQ designed for the microphone.

The invention offers a new use case where a parameter can be entered into the apparatus (such as a distance parameter for example, and such as manually by a user for example) which can be used to automatically update recording levels and/or make a suggestion to the user to achieve a better sound recording based upon a sound level (and/or other received sound characteristics) and characteristics of the microphone or apparatus. Although the invention is preferably based on an external parameter which is provided by the user, in an alternative embodiment the external parameter (such as the distance for example) may be provided automatically. An example of automatically updating recording levels could comprise the apparatus determining that a first sound from the sound source is soft (no clipping occurring), and then, based upon the sound level of the first sound received and the characteristics of the microphone, asking the user if he/she wants to use automatic gain control to increase the recording level of the sound. This could be used for example at a child's piano recital where a parent with the apparatus is not close to a child playing the piano, the sound from the piano is not loud, and the rest of the audience watching the recital is very quite. By the user accepting the suggestion to use this type of sound situation setting, the microphone gain could be increased by a lot, but automatically adjust when the audience claps at the end of the recital song, and the apparatus could then automatically switch back to the non-suggested recording setting. This is only an example, and should not be considered as limiting.

In one type of example embodiment an apparatus 10 is provided comprising a recording system 28 for recording at least sound, the recording system comprising a microphone 32; a distance input 30 adapted to have an initial distance (Distance A) between a source 42 of the sound and the apparatus 10 entered into the apparatus; and a controller 20 connected to the microphone 32, the controller being configured to determine a suggested distance (Distance B, or the difference Distance B-A or Distance A-B) for a better sound recording by the recording system based, at least partially, on the initial distance input into the distance input. The recording system 28 can comprise a solid state memory 36. The microphone 32 can comprise a fixed gain output microphone, and the recording system can comprise a variable gain amplifier 44. The distance input 30 can comprise a user interface 14 which is configured to allow a user to manually input distance information regarding the initial distance into the apparatus. The user interface 14 can comprise a touch screen. The distance input 30 can comprises a distance measurement device 50 or 56 which is configured to measure the initial distance (Distance A) and automatically input the initial distance into the distance input 30. The apparatus can comprise a user actuator 14 for allowing a user to selectively activate the distance measurement device. The recording system 28 can be configured to record video. The apparatus can comprises a telephone with a transmitter 18 and a receiver 16. The apparatus can comprise a display screen, and be configured to display on the display screen a difference between the initial distance (Distance A) and the suggested distance (Distance B). The apparatus can be configured to display a suggestion 70 to the user to move the apparatus towards the source of the sound or away from the source of the sound. The message 70 could be used in conjunction with a graphical display of the sound quality to show the severity of any clipping.

In accordance with an example embodiment of the invention, a method can be provided comprising receiving by an apparatus 10 a first sound from a source of sound 42; and determining by the apparatus a suggestion to be provided to a user of the apparatus for better sound recording by a microphone of the apparatus of sound from the source of sound.

In accordance with an example embodiment of the invention, a method can be provided comprising receiving 58 by an apparatus 10 first distance information regarding a distance (Distance A) between the apparatus 10 and a source 42 of sound; determining 60, 62 by the apparatus a second distance (Distance B or Distance B-A or Distance A-B) which the apparatus should be moved relative to the source of sound for better sound recording by a microphone of the apparatus; and based upon the determined second distance, suggesting 62, 70 by the apparatus to the user a change in distance between the apparatus and the source of sound. Receiving the first distance information can comprise a user manually inputting the first distance information into the apparatus. The apparatus can comprise a touch screen and the user can manually input the first distance information into the touch screen. Receiving the first distance information can comprise a distance measuring device of the apparatus inputting the first distance information into the apparatus. The apparatus can display the second distance on a display screen of the apparatus. The apparatus can displays a difference (Distance B-A or Distance A-B) between the first distance information and the second distance on a display screen of the apparatus. In one example embodiment the step of receiving the first distance information could be input by or received from the manufacturer (such as one meter for example) as a pre-programmed distance, and the apparatus 10 can be configured to prompt the user to play/sing something from the distance A from the apparatus 10. Thus, the user does not need to input the initial distance information.

An example embodiment of the invention can comprise a program storage device (such as memory 24 for example or other storage medium) readable by a machine (such as 10), tangibly embodying a program of instructions executable by the machine for performing operations, the operations comprising: upon receiving by an apparatus 10 input comprising first distance information regarding a distance (Distance A) between the apparatus and a source 42 of sound, determining by the apparatus whether the apparatus should be moved relative to the source of sound for a better sound recording by a microphone 32 of the apparatus; and if the apparatus determines that the apparatus should be moved relative to the source of sound for the better sound recording by the microphone of the apparatus, then suggesting 62, 70 by the apparatus to the user a change in distance between the apparatus and the source of sound.

An example embodiment of the invention can comprise a program storage device (such as memory 24 for example or other storage medium) readable by a machine, tangibly embodying a program of instructions executable by the machine for performing operations, the operations comprising, upon receiving by an apparatus input comprising a first sound from a sound source, determining by the apparatus a suggestion for the user for a better sound recording by a microphone of the apparatus; and if the apparatus determines that the apparatus should be moved relative to the sound source for the better sound recording by the microphone of the apparatus, then providing the user the suggestion by the apparatus.

An example embodiment of the invention can comprise an apparatus 10 comprising a recording system 28 for recording at least sound, the recording system comprising a microphone 32; and a controller 20 connected to the microphone, the controller being configured to determine a suggestion (such as 70, 72 for example) for the user, for subsequent recording of a second sound from a sound source, based upon characteristics of the microphone and a sound level of a first sound from the sound source received by the microphone. The suggestion can comprises a suggestion to change location, position, and/or orientation of the apparatus relative to the sound source. The suggestion can comprise asking the user if he/she desires to activate a noise cancelling feature or a directionality feature of the microphone. The suggestion can comprise asking the user if he/she desires to have gain automatically adjusted. The apparatus can further comprise an input for inputting an external parameter into the apparatus, and where the controller is configured to use the external parameter and the sound level of the first sound for determining the suggestion to the user. The input can be configured to input a distance between the microphone and the sound source. The input can be configured to allow a user to select a noise canceller/directionality feature of the microphone.

An example embodiment of the present invention may provide a system wherein a suitably configured-user interface (UI) provides the user with the ability to enter a value representing a recording distance between the source signal and the microphone. The microphone gain level is then relatively adjusted. Although the invention is preferably based on an external parameter which is provided by the user, in an alternative embodiment the external parameter such as the distance may be provided automatically. An advantage of an example embodiment of the invention is a simple, straightforward and cheap implementation, where no complexity is introduced, yet audio recording is improved. All that is needed for this example is a suitably configured user interface and software support that can possibly modify gain levels which may be variable and/or fixed gain levels in analogue domain and/or possibly in digital domain such as the level of digital EQ designed for microphone. A novel feature for this example is the ability to offer a new use situation where the user can manually enters a distance parameter which can automatically update recording levels.

Figure 11:
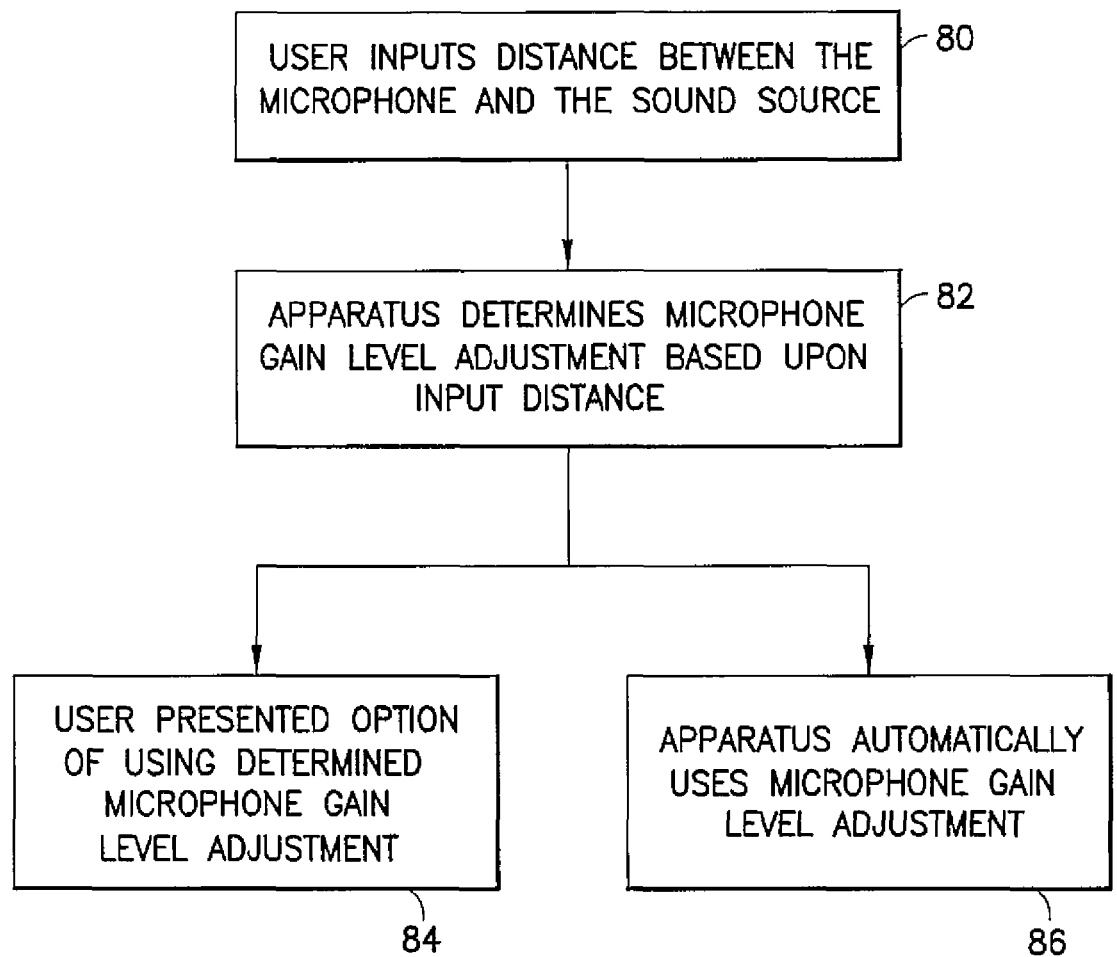
FIG. 11 is a block diagram illustrating some steps of a method of the invention.

The method of this example is illustrated in FIG. 11. As indicated by block 80, a user can input a distance (such as Distance A) between the microphone 32/10 and the sound source 42. As indicated by block 82, the apparatus 10 can determine a microphone gain level adjustment based, at least partially, upon the distance input by the user. This input could comprise the user activating a distance measuring device of the apparatus rather than manually input the distance at the user interface. The user could be presented an option of whether or not the apparatus should use the microphone gain level adjustment as indicated by block 84, or the apparatus 10 could be configured to automatically use the microphone gain level adjustment as indicated by block 86. Thus, the invention can relate to an apparatus wherein a microphone recording level is adjusted using an external parameter provided by the user.

In one example embodiment the user merely needs to input the external parameter (such as Distance A) into the apparatus and the controller can be configured to implement the gain level adjustment without any other input. The controller could be configured to determine the change for a better sound recording based on the initial distance input into the distance input. The "better sound" could comprise, for example:

for sound which is too loud for the microphone, a change to prevent or reduce clipping by the microphone, or for sound which is too soft, a change to increase the level of the sound signal from the microphone such as by moving the microphone closer to the sound source, or perhaps a range between an upper decibel level and a lower decibel level where the gain adjuster makes multiple adjustments to attempt to keep the signal from the microphone within the range.

In another example embodiment, the controller could be configured to use more than one input to determine the change. For example, controller could be configured to use the external parameter (such as Distance A) input into the apparatus and a second input to determine the change. The second input could be a signal provided by the microphone for example. Thus, in this example embodiment, the controller could be configured to determine the change based on a signal provided by the microphone and on the initial distance input into the distance input.

It should be understood that the foregoing description is only illustrative of the invention. Various alternatives and modifications can be devised by those skilled in the art without departing from the invention. For example, features recited in the various dependent claims could be combined with each other in any suitable combination(s). In addition, features from different embodiments described above could be selectively combined into a new embodiment. Accordingly, the invention is intended to embrace all such alternatives, modifications and variances which fall within the scope of the appended claims.

What is claimed is:

1. An apparatus comprising:
   a recording system comprising at least one microphone;
   a controller comprising a processor and a non-transitory memory, where the controller is configured to automatically adjust at least one recording parameter for an output signal from the at least one microphone based, at least partially, upon a detected clipping or a distortion of the output signal from the at least one microphone at a recording distance between the apparatus and a target sound source, where the adjustment of the at least one recording parameter is configured to prevent the detected clipping or distortion of the output signal from the at least one microphone at the recording distance, where the adjustment is based, at least partially, on the recording distance, where the controller is configured to capture the target sound source using the at least one microphone with the adjusted at least one recording parameter,
   where the apparatus is a portable electronic device.

2. An apparatus as in claim 1, further comprising a camera autofocus sensor, where the recording distance between the apparatus and the target sound source is determined based on the camera autofocus sensor.

3. An apparatus as in claim 1, further comprising a radar sensor, where the recording distance between the apparatus and the target sound source is determined based on the radar sensor.

4. An apparatus as in claim 1, further comprising an ultrasonic frequency sensor, where the recording distance between the apparatus and the target sound source is determined based on the ultrasonic frequency sensor.

5. An apparatus as in claim 1, further comprising a user interface configured to allow a user to input and/or select distance information on the user interface, where the recording distance between the apparatus and the target sound source is determined based on the input and/or the selected distance information.

6. An apparatus as in claim 1 where the controller is configured to, based at least partially upon the detected clipping or distortion of the output signal from the at least one microphone and the recording distance between the apparatus and the target sound source, determine that the recording distance between the apparatus and the target sound source is to be changed; and indicate to a user of the apparatus to increase or decrease the recording distance between the apparatus and the target sound source.

7. An apparatus as in claim 1 where the controller is configured to, based upon the recording distance, indicate to a user of the apparatus to change at least one sound recording feature of the apparatus.

8. An apparatus as in claim 1 where the apparatus is configured to present a user with selection options on a user interface of the apparatus regarding at least one environmental recording parameter and, based at least partially upon a selection of the user of at least one of the selection options and the recording distance between the apparatus and the target sound source, adjust the at least one recording parameter for the output signal from the at least one microphone.

9. An apparatus comprising:
   at least one processor; and
   at least one non-transitory memory including computer program code, the at least one non-transitory memory and the computer program code configured to, with the at least one processor, cause the apparatus to:
      based at least partially upon detected clipping or distortion of an output signal from at least one microphone of the apparatus at a recording distance between the apparatus and a target sound source, determine that the recording distance between the apparatus and the target sound source is to be changed; and
      based upon the determination, indicate to a user of the apparatus to increase or decrease the recording distance between the apparatus and the target sound source, where the indicating to the user to increase or decrease the recording distance between the apparatus and the target sound source is configured to prevent the detected clipping or the detected distortion of the output signal from the at least one microphone.

10. An apparatus as in claim 9 where the apparatus is configured to indicate to the user on a touch screen display of the apparatus.

11. An apparatus as in claim 9 where the at least one non-transitory memory and the computer program code are configured to, with the at least one processor, cause the apparatus to: based upon an input from at least one sensor which does not comprise a microphone, determine the recording distance between the apparatus and the target sound source.

12. An apparatus as in claim 9 where the indicating to the user comprises at least one of sending a message to the user to change a location of the apparatus relative to the target sound source or presenting the user with a pictorial or graphical symbol on a display of the apparatus to move the apparatus relative to the target sound source.

13. An apparatus as in claim 9 where the at least one non-transitory memory and the computer program code are configured to, with the at least one processor, cause the apparatus to: indicate to the user of the apparatus to change at least one sound recording feature of the apparatus.

14. An apparatus as in claim 9 where the at least one non-transitory memory and the computer program code are configured to, with the at least one processor, cause the apparatus to:
   present the user with selection options on a user interface of the apparatus regarding at least one environmental recording parameter; and
   based at least partially upon a selection of the user of at least one of the selection options and the recording distance between the apparatus and the target sound source, adjust a recording parameter for the output signal from the at least one microphone of the apparatus.

15. An apparatus comprising:
   at least one processor; and
   at least one non-transitory memory including computer program code, the at least one non-transitory memory and the computer program code configured to, with the at least one processor, cause the apparatus to:

detect clipping or distortion of an output signal from at least one microphone; and based upon the detected clipping or distortion of the output signal from the at least one microphone at a recording distance between the apparatus and a target sound source, indicate to a user of the apparatus to change at least one sound recording feature of the apparatus, where the indicating to the user to change the at least one sound recording feature of the apparatus is configured to prevent the detected clipping or distortion of the output signal from the at least one microphone at the recording distance, where the at least one sound recording feature comprises at least one of:

a noise canceler feature, a directionality feature, or a filtering feature.

16. An apparatus as in claim 15 where the apparatus is configured to determine the recording distance based upon at least one of an input from the user at a user interface of the apparatus or at least one sensor.

17. An apparatus as in claim 16 where the at least one sensor comprises a camera autofocus sensor.

18. An apparatus as in claim 15 where the indicating to the user comprises selection options regarding the at least one sound recording feature displayed on a touch screen of the apparatus.

19. An apparatus comprising:

at least one processor; and at least one non-transitory memory including computer program code, the at least one non-transitory memory and the computer program code configured to, with the at least one processor, cause the apparatus to:

detect clipping or distortion of an output signal from at least one microphone at a recording distance between the apparatus and a target sound source;

present a user with selection options on a user interface of the apparatus regarding at least one environmental recording parameter; and based at least partially upon a selection of the user of at least one of the selection options and the detected clipping or distortion of the output signal from the at least one microphone at the recording distance, adjust a recording parameter for the output signal from the at least one microphone, where the adjustment of the at least one recording parameter is configured to prevent the detected clipping or distortion of the output signal from the at least one microphone at the recording distance.

20. An apparatus as in claim 19 where the at least one non-transitory memory and the computer program code are configured to, with the at least one processor, cause the apparatus to: based upon an input from at least one sensor which does not comprise a microphone, determine the recording distance between the apparatus and the target sound source.

* * * * *